United States Patent
Abe et al.

(10) Patent No.: US 11,041,967 B2
(45) Date of Patent: Jun. 22, 2021

(54) RADIATION DETECTOR AND METHOD FOR MANUFACTURING SAME

(71) Applicant: HAMAMATSU PHOTONICS K.K., Hamamatsu (JP)

(72) Inventors: Keiji Abe, Hamamatsu (JP); Toshiyuki Izawa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 244 days.

(21) Appl. No.: 16/310,867

(22) PCT Filed: May 16, 2017

(86) PCT No.: PCT/JP2017/018322
§ 371 (c)(1),
(2) Date: Dec. 18, 2018

(87) PCT Pub. No.: WO2018/003328
PCT Pub. Date: Jan. 4, 2018

(65) Prior Publication Data
US 2020/0309970 A1     Oct. 1, 2020

(30) Foreign Application Priority Data

Jun. 30, 2016  (JP) .............................. JP2016-130674

(51) Int. Cl.
*G01T 1/24*     (2006.01)
*G01T 7/00*     (2006.01)

(52) U.S. Cl.
CPC . *G01T 1/24* (2013.01); *G01T 7/00* (2013.01)

(58) Field of Classification Search
CPC .................................... G01T 1/24; G01T 7/00
(Continued)

(56) References Cited

U.S. PATENT DOCUMENTS

2015/0249170 A1* 9/2015 Snaith ............. H01L 31/035272
136/256
2015/0380667 A1* 12/2015 Koposov ............. H01L 51/4233
136/256
(Continued)

FOREIGN PATENT DOCUMENTS

CN        101681915 A      3/2010
JP        2000-256098 A    9/2000
(Continued)

OTHER PUBLICATIONS

International Preliminary Report on Patentability dated Jan. 10, 2019 for PCT/JP2017/018322.
(Continued)

*Primary Examiner* — Kiho Kim
(74) *Attorney, Agent, or Firm* — Faegre Drinker Biddle & Reath LLP

(57) ABSTRACT

A radiation detector includes a substrate having a plurality of charge collection electrodes, a radiation absorption layer disposed on one side with respect to the substrate and formed of a perovskite material, a voltage application electrode disposed on the one side with respect to the radiation absorption layer, a bias voltage being applied to the voltage application electrode so that a potential difference is generated between the voltage application electrode and each of the plurality of charge collection electrodes, and a protective member disposed on the one side with respect to the substrate and being in contact with at least portions opposite to each other in a side surface of the radiation absorption layer.

12 Claims, 5 Drawing Sheets

(58) Field of Classification Search
USPC .................................................. 250/370.01
See application file for complete search history.

(56) References Cited

U.S. PATENT DOCUMENTS

| | | | |
|---|---|---|---|
| 2017/0301479 A1* | 10/2017 | Moehl | H01G 9/2018 |
| 2018/0033983 A1* | 2/2018 | Yang | H01L 51/0032 |
| 2018/0096796 A1* | 4/2018 | Yang | H01G 9/2018 |
| 2018/0277309 A1* | 9/2018 | Etgar | H01G 9/2009 |
| 2018/0286923 A1* | 10/2018 | Fischer | G01T 1/24 |
| 2018/0298278 A1* | 10/2018 | Zhong | H01L 51/502 |

FOREIGN PATENT DOCUMENTS

| | | | | |
|---|---|---|---|---|
| JP | 2010-118602 A | | 5/2010 | |
| JP | 2010118602 A | * | 5/2010 | |
| WO | WO-2016091442 A1 | * | 6/2016 | H01G 9/2009 |

OTHER PUBLICATIONS

Sergii Yakunin et al., "Detection of X-ray photons by solution-processed lead halide perovskites," Nature Photonics, May 25, 2015, pp. 444-449, vol. 9.

Constantinos C. Stoumpos et al., "Crystal Growth of the Perovskite Semiconductor $CsPbBr_3$: A New Material for High-Energy Radiation Detection," Crystal Growth & Design, Jul. 2013, pp. 2722-2727, vol. 13, No. 7.

Bálint Náfrádi et al., "Methylammonium Lead Iodide for Efficient X-ray Energy Conversion," The Journal of Physical Chemistry, Oct. 2015, pp. 25204-25208, vol. 119.

* cited by examiner

RADIATION DETECTOR AND METHOD FOR MANUFACTURING SAME

TECHNICAL FIELD

The present disclosure relates to a radiation detector and a method for manufacturing the same.

BACKGROUND ART

Perovskite materials have been suggested as materials applicable to a radiation absorption layer of a radiation detector. Since perovskite materials are inexpensive as compared with CsI, a-Se, CdTe, or the like, perovskite materials are expected to have superiority in fields in which large-area radiation detectors are required (for example, the medical field or the non-destructive inspection field). Non-Patent Literature 1 describes a direct conversion type radiation detector including a radiation absorption layer formed of a perovskite material.

CITATION LIST

Non-Patent Literature

Non-Patent Literature 1: "Detection of X-ray photons by solution-processed lead halide perovskites", NATURE PHOTONICS, UK, Nature publishing Group, May 25, 2015, Vol. 9, p. 444-449

SUMMARY OF INVENTION

Technical Problem

In the direct conversion type radiation detector as described above, it is preferable for the thickness of the radiation absorption layer to be large, for example, 100 µm or more. On the other hand, since the perovskite material is fragile and vulnerable to moisture, it is important to ensure mechanical strength and moisture-proofness in the radiation absorption layer formed of a perovskite material. However, in the radiation absorption layer formed of a perovskite material, it is difficult for the mechanical strength and the moisture-proofness to be ensured when the thickness of the radiation absorption layer is increased.

Therefore, an object of the present disclosure is to provide a radiation detector capable of securing sufficient mechanical strength and moisture-proofness in a radiation absorption layer formed of a perovskite material, and a method for manufacturing such a radiation detector.

Solution to Problem

A radiation detector according to an embodiment of the present disclosure includes a substrate having a plurality of charge collection electrodes; a radiation absorption layer disposed on one side with respect to the substrate and formed of a perovskite material; a voltage application electrode disposed on the one side with respect to the radiation absorption layer, a bias voltage being applied to the voltage application electrode so that a potential difference is generated between the voltage application electrode and each of the plurality of charge collection electrodes; and a protective member disposed on the one side with respect to the substrate and being in contact with at least portions opposite to each other in a side surface of the radiation absorption layer.

In this radiation detector, the protective member is in contact with the side surface of the radiation absorption layer formed of a perovskite material. Since the side surface is a region in which it is particularly difficult to ensure mechanical strength and moisture-proofness, the protective member being in contact with the side surface is effective in ensuring the mechanical strength and the moisture-proofness of the radiation absorption layer. Particularly, the protective member being in contact with at least portions opposite to each other in the side surface is effective in ensuring the mechanical strength of the radiation absorption layer. Therefore, according to this radiation detector, it is possible to ensure sufficient mechanical strength and moisture-proofness in the radiation absorption layer formed of a perovskite material.

In the radiation detector according to an embodiment of the present disclosure, the protective member may form an opening region on the one side with respect to the radiation absorption layer and the voltage application electrode. Accordingly, since it is unnecessary to dispose the protective member on one side with respect to the radiation absorption layer and the voltage application electrode, it is possible to simplify a configuration of the radiation detector.

In the radiation detector according to an embodiment of the present disclosure, the protective member may be formed of an insulating material. Accordingly, since it is difficult for an electric field generated between the charge collection electrode near the protective member and the voltage application electrode to be influenced by the protective member, it is possible to suppress degradation of electrical characteristics of the charge collection electrode near the protective member.

In the radiation detector according to an embodiment of the present disclosure, the protective member may be formed of a conductive material. Accordingly, since it is difficult for the electric field generated between the charge collection electrode near the protective member and the voltage application electrode to be influenced by the protective member, for example, due to electrically connecting the protective member to a constant potential, it is possible to suppress degradation of electrical characteristics in the charge collection electrode near the protective member.

In the radiation detector according to an embodiment of the present disclosure, the protective member may be electrically connected to a constant potential. Accordingly, since it is difficult for the electric field generated between the charge collection electrode near the protective member and the voltage application electrode to be influenced by the protective member, it is possible to suppress degradation of electrical characteristics in the charge collection electrode near the protective member.

In the radiation detector according to an embodiment of the present disclosure, the voltage application electrode may be spaced apart from the protective member. Accordingly, it is possible to prevent such a situation in which uniformity of the electric field generated between the charge collection electrode and the voltage application electrode due to contact between the voltage application electrode and the protective member is impaired.

In the radiation detector according to an embodiment of the present disclosure, a surface on the one side in the radiation absorption layer may include a flat surface on which the voltage application electrode is disposed and a curved surface located between the flat surface and a surface on the radiation absorption layer side in the protective member, the flat surface may be located on the substrate side with respect to an end surface on the one side in the protective member, and the curved surface may be curved to become closer to the end surface of the protective member as a distance from the flat surface increases. Accordingly, it is difficult for the protective member to peel off from the radiation absorption layer, and even when an external force acts on the protective member, it is difficult for the external force to be transmitted to the voltage application electrode.

In the radiation detector according to an embodiment of the present disclosure, the surface on the one side in the radiation absorption layer may be a flat surface flush with an end surface on the one side in the protective member. Accordingly, it is possible to increase the thickness of the radiation absorption layer, and to use a portion near the protective member in the radiation absorption layer as an effective region.

The radiation detector according to an embodiment of the present disclosure may further include a moisture-proof layer that covers at least the radiation absorption layer and the voltage application electrode. Accordingly, it is possible to more reliably ensure sufficient moisture-proofness in the radiation absorption layer and the voltage application electrode.

In the radiation detector according to an embodiment of the present disclosure, the protective member may annularly surround the side surface of the radiation absorption layer. Accordingly, it is possible to more reliably ensure sufficient mechanical strength and moisture-proofness on the side surface of the radiation absorption layer.

In the radiation detector according to an embodiment of the present disclosure, the thickness of the radiation absorption layer may be equal to or greater than 100 μm and equal to or smaller than 1 mm. Accordingly, it is possible to improve both absorption efficiency for X-rays and collection efficiency for charge.

A method for manufacturing a radiation detector according to an embodiment of the present disclosure includes a first step of disposing a frame member on one side with respect to a substrate including a plurality of charge collection electrodes; a second step of disposing a solution containing a perovskite material and a solvent inside the frame member; a third step of removing the solvent from the solution to form a radiation absorption layer formed of the perovskite material; a fourth step of disposing a voltage application electrode on the one side with respect to the radiation absorption layer; and a fifth step of forming a moisture-proof layer covering at least the radiation absorption layer and the voltage application electrode in a state in which at least a portion of the frame member is left as a protective member being in contact with at least portions opposite to each other in a side surface of the radiation absorption layer.

According to the method for manufacturing a radiation detector, it is possible to obtain a radiation detector of which sufficient mechanical strength and moisture-proofness are ensured in the radiation absorption layer formed of the perovskite material.

Advantageous Effects of Invention

According to the present disclosure, it is possible to provide a radiation detector capable of securing sufficient mechanical strength and moisture-proofness in a radiation absorption layer formed of a perovskite material, and a method for manufacturing such a radiation detector.

DESCRIPTION OF EMBODIMENTS

Figure 1:
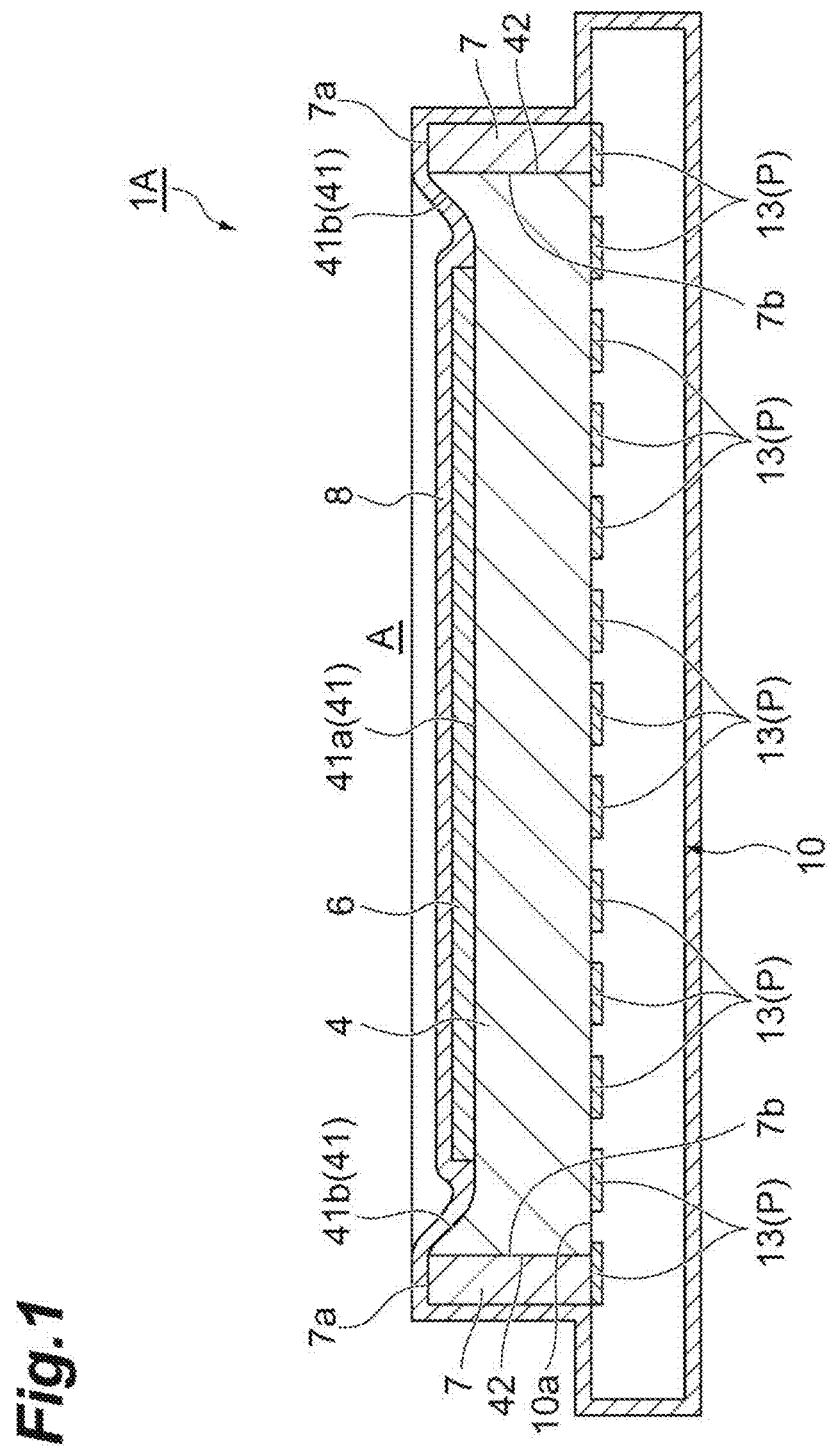
FIG. 1 is a cross-sectional view of a radiation detector according to a first embodiment.

Hereinafter, embodiments of the present disclosure will be described in detail with reference to the drawings. In respective figures, the same or corresponding parts are denoted by the same reference numerals, and duplicate description will be omitted.

First Embodiment

As illustrated in FIG. 1, the radiation detector 1A includes a panel (substrate) 10, a radiation absorption layer 4, a voltage application electrode 6, a protective member 7, and a moisture-proof layer 8. The radiation detector 1A is, for example, a solid-state imaging device that detects X-rays as radiation to form an X-ray transmission image.

Figure 2:
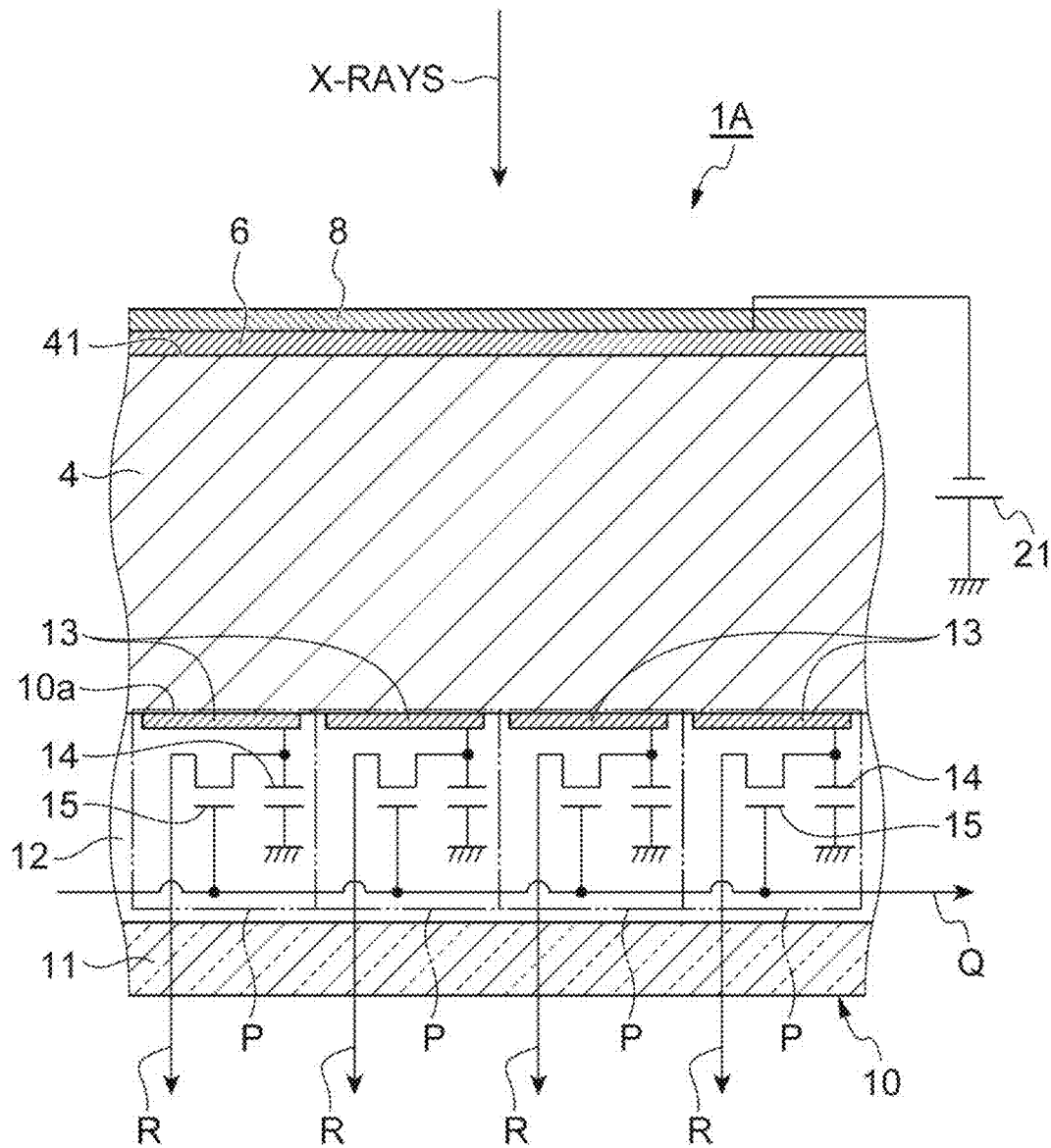
FIG. 2 is an enlarged sectional view of the radiation detector of FIG. 1.

As illustrated in FIG. 2, the panel 10 includes a support substrate 11 formed of an insulating material such as glass, and a functional layer 12 in which a plurality of pixels P are provided. Each pixel P includes a charge collection electrode 13, a capacitor 14, and a thin film transistor 15. One electrode of the capacitor 14 is electrically connected to the charge collection electrode 13. The other electrode of the capacitor 14 is electrically connected to a ground potential. One current terminal of the thin film transistor 15 is electrically connected to a wiring which electrically connects the one electrode of the capacitor 14 to the charge collection electrode 13. The other current terminal of the thin film transistor 15 is electrically connected to a reading wiring R. A control terminal of the thin film transistor 15 is electrically connected to a row selection wiring Q.

The thin film transistor 15 is configured as a field effect transistor (FET) or a bipolar transistor. When the thin film transistor 15 is configured as an FET, the control terminal corresponds to a gate, and the current terminal corresponds to a source or a drain. When the thin film transistor 15 is configured as a bipolar transistor, the control terminal corresponds to a base, and the current terminal corresponds to a collector or an emitter.

Figure 3:
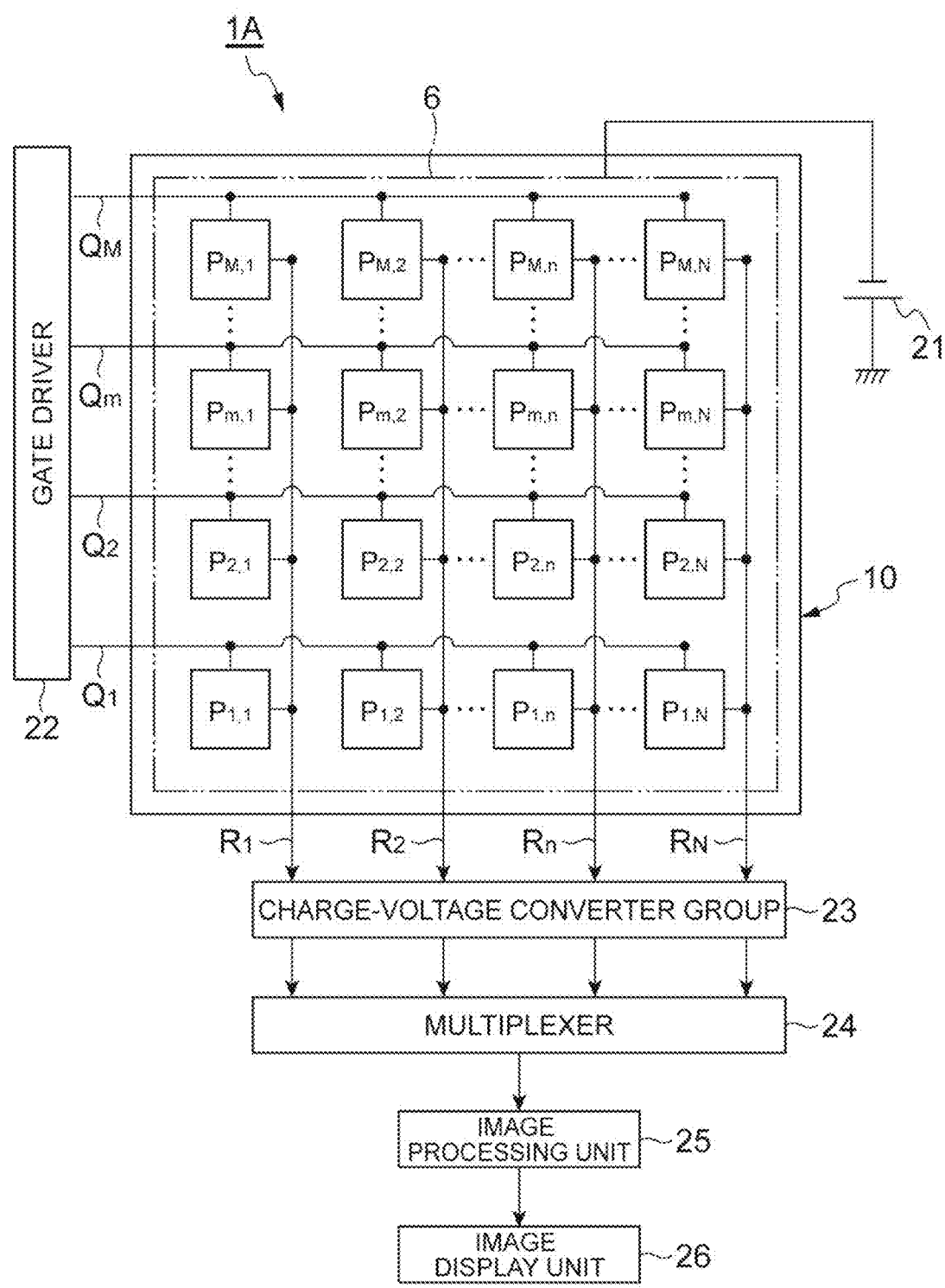
FIG. 3 is a configuration diagram of the radiation detector of FIG. 1.

As illustrated in FIG. 3, in the panel 10, a plurality of pixels P are arranged in a matrix form. A pixel $P_{m,n}$ means a pixel that is located in an m-th row and an n-th column. m is an integer equal to or greater than 1 and equal to or smaller than M (an integer equal to or greater than 2), and n is an integer equal to or greater than 1 and equal to or smaller than N (an integer equal to or greater than 2). The control terminal of the thin film transistor 15 included in each of the N pixels $P_{m,n}$ arranged in the m-th row is electrically connected to one row selection wiring $Q_m$ arranged in the m-th row. The other current terminal of the thin film transistor 15 included in each of the M pixels $P_{m,n}$ arranged in the n-th column is electrically connected to one reading wiring Rn arranged in the n-th column.

As illustrated in FIGS. 1 and 2, the radiation absorption layer 4 is disposed on a surface 10a on one side of the panel 10. That is, the radiation absorption layer 4 is disposed on one side with respect to the panel 10. The radiation absorption layer 4 is formed of a perovskite material. An example of the perovskite material includes a methylammonium lead halide such as $CH_3NH_3PbCl_xBr_yI_{(3-x-y)}$ (0<x+y<3), $CH_3NH_3PbCl_xI_{(3-x)}$, (0<x<3), $CH_3NH_3PbCl_3$, $CH_3NH_3PbBr_3$, or $CH_3NH_3PbI_3$. When incident X-rays are absorbed by the radiation absorption layer 4, charge (electrons and holes) is generated according to the amount of absorption.

A thickness of the radiation absorption layer 4 (more specifically, a thickness of the radiation absorption layer 4 in a flat surface 41a to be described below) is, for example, 1 µm to 2 mm. When the thickness of the radiation absorption layer 4 is equal to or greater than 100 µm, absorption efficiency of the X-rays is improved. When the thickness of the radiation absorption layer 4 is equal to or smaller than 1 mm, disappearance of charge generated due to the absorption of the X rays (that is, disappearance due to recombination of electrons and holes) is suppressed, and collection efficiency of the charge is improved.

The voltage application electrode 6 is disposed on the surface 41 on one side in the radiation absorption layer 4. That is, the voltage application electrode 6 is disposed on one side with respect to the radiation absorption layer 4. The voltage application electrode 6 is formed of a conductive material. Examples of the conductive material include a metal such as aluminum, gold, silver, platinum, or titanium, a conductive metal oxide such as tin-added indium oxide (ITO), fluorine-added tin oxide (FTO), tin oxide ($SnO_2$), indium zinc oxide (IZO), or zinc oxide (ZnO), or an organic conductive material containing a conductive polymer or the like. A bias voltage is applied to the voltage application electrode 6 by a bias voltage supply power supply 21. Accordingly, a negative potential difference is generated between the voltage application electrode 6 and the charge collection electrode 13 of each pixel P opposite to each other via the radiation absorption layer 4.

As illustrated in FIG. 1, the protective member 7 is disposed on the surface 10a on one side in the panel 10. That is, the protective member 7 is disposed on one side with respect to the panel 10. The protective member 7 annularly surrounds a side surface 42 of the radiation absorption layer 4 and is in contact with the side surface 42 of the radiation absorption layer 4 over an entire circumference. The protective member 7 forms an opening region A on one side with respect to the radiation absorption layer 4 and the voltage application electrode 6. That is, the protective member 7 does not cover the radiation absorption layer 4 and the voltage application electrode 6 from one side. The protective member 7 may be formed of an insulating material or may be formed of a conductive material. Examples of the material of the protective member 7 include a resin, a photoresist material, glass, and a metal. In a case in which the protective member 7 is formed of the conductive material, the protective member 7 may be electrically connected to a constant potential (for example, a ground potential or a reference potential).

The surface 41 of the radiation absorption layer 4 includes the flat surface 41a and a curved surface 41b. The flat surface 41a is a region in which the voltage application electrode 6 is disposed in the surface 41. The voltage application electrode 6 disposed on the flat surface 41a is spaced apart from the protective member 7. The flat surface 41a is located on the panel 10 side with respect to an end surface 7a on one side in the protective member 7. That is, a distance from the surface 10a of the panel 10 to the flat surface 41a of the radiation absorption layer 4 (that is, a thickness of the radiation absorption layer 4 in the flat surface 41a) is smaller than a distance from the surface 10a of the panel 10 to the end surface 7a of the protective member 7 (that is, a height of the protective member 7). The curved surface 41b is a region located between the flat surface 41a and a surface 7b on the radiation absorption layer 4 side in the protective member 7 (that is, a surface in contact with the side surface 42 of the radiation absorption layer 4). In the present embodiment, since the protective member 7 is formed in an annular shape, the curved surface 41b extends annularly inside the protective member 7 when viewed in an incidence direction of the X-rays. The curved surface 41b is curved to become closer to the end surface 7a of the protective member 7 as a distance from the flat surface 41a increases and to be in contact with the flat surface 41a.

It should be noted that the voltage application electrode 6 disposed on the flat surface 41a is opposite to the charge collection electrodes 13 other than some of the charge collection electrodes 13 via the radiation absorption layer 4. In this case, for example, when an X-ray transmission image is formed, it is unnecessary to read charges from some pixels P including some of the charge collection electrodes 13, and therefore, it is possible to increase a speed of reading the charge. Further, since the material of the protective member 7 is different from the material of the radiation absorption layer 4, a region near the protective member 7 is easily made electrically non-uniform, but it is possible to control charge, dark current, and the like generated in the region using the some of the charge collection electrodes 13. Of course, the voltage application electrode 6 disposed on the flat surface 41a may be opposite to all the charge collection electrodes 13 via the radiation absorption layer 4.

The moisture-proof layer 8 covers the entire outer surfaces of the panel 10, the radiation absorption layer 4, the voltage application electrode 6, and the protective member 7. The moisture-proof layer 8 is formed of, for example, a resin film formed of parylene or the like, an oxide film formed of $Al_2O_3$ or the like, and a nitride film formed of SiN or the like.

The radiation detector 1A configured as described above is used as follows. As illustrated in FIG. 3, the voltage application electrode 6 of the radiation detector 1A is electrically connected to the bias voltage supply power supply 21. The row selection wiring $Q_m$ of the radiation detector 1A is electrically connected to a gate driver 22, and the reading wiring $R_n$ of the radiation detector 1A is electrically connected to a multiplexer 24 via a charge-voltage converter group 23. Further, the multiplexer 24 is electrically connected to an image processing unit 25, and the image processing unit 25 is electrically connected to an image display unit 26. It should be noted that the gate driver 22, the charge-voltage converter group 23, the multiplexer 24, and the like may be formed in the panel 10 as components of the radiation detector 1A.

In this state, as illustrated in FIG. 2, when the X-rays with which an imaging target has been irradiated are incident on the radiation absorption layer 4 and the X-rays are absorbed in the radiation absorption layer 4, charge (electrons and holes) is generated according to the amount of absorption of the X-rays in the radiation absorption layer 4. In this case, a bias voltage is applied to the voltage application electrode 6 by the bias voltage supply power supply 21 so that a negative potential difference is generated between the voltage application electrode 6 and the charge collection electrode 13 of each pixel P opposite to each other via the radiation absorption layer 4. Therefore, in charge generated in the radiation absorption layer 4 due to the absorption of the X-rays, the electrons are collected in the charge collection electrode 13 of each pixel P due to an action of the bias voltage, and accumulated in the capacitor 14 of each pixel P. On the other hand, in the charge generated in the radiation absorption layer 4 due to the absorption of the X-rays, the holes are transported to the voltage application electrode 6.

As illustrated in FIGS. 2 and 3, a control signal is transmitted from the gate driver 22 via the row selection wiring $Q_m$ of the m-th row, and the thin film transistor 15 of each pixel $P_{m,n}$ of the m-th row is turned ON. The gate driver 22 sequentially performs the transmission of this control signal for all the row selection wirings $Q_m$. Accordingly, the charge accumulated in the capacitor 14 of each pixel $P_{m,n}$ in the m-th row is input to the charge-voltage converter group 23 via the corresponding reading wiring $R_n$, and a voltage signal according to the amount of charge is input to the multiplexer 24. The multiplexer 24 sequentially outputs the voltage signal according to the amount of charge accumulated in the capacitor 14 of each pixel $P_{m,n}$ to the image processing unit 25. The image processing unit 25 forms an X-ray transmission image of the imaging target on the basis of the voltage signal input from the multiplexer 24, and causes the image display unit 26 to display the X-ray transmission image.

As described above, in the radiation detector 1A, the protective member 7 is in contact with the side surface 42 of the radiation absorption layer 4 formed of the perovskite material. Since the side surface 42 is a region in which it is particularly difficult to secure mechanical strength and moisture-proofness, the protective member 7 being in contact with the side surface 42 is effective in securing the mechanical strength and moisture-proofness of the radiation absorption layer 4. Therefore, according to the radiation detector 1A, it is possible to ensure sufficient mechanical strength and moisture-proofness in the radiation absorption layer 4 formed of the perovskite material. In particular, in the radiation detector 1A, the protective member 7 annularly surrounds the side surface 42 of the radiation absorption layer 4 and is in contact with the side surface 42 of the radiation absorption layer 4 over the entire circumference. Therefore, sufficient mechanical strength and moisture-proofness are more reliably ensured on the side surface 42 of the radiation absorption layer 4.

In the direct conversion type radiation detector 1A as described above, it is preferable for the thickness of the radiation absorption layer 4 to be large, for example, 100 μm or more. On the other hand, since the perovskite material is fragile and vulnerable to moisture, it is important to ensure mechanical strength and moisture-proofness in the radiation absorption layer 4 formed of the perovskite material. However, in the radiation absorption layer 4 formed of the perovskite material, it is difficult for the mechanical strength and the moisture-proofness to be ensured particularly on the side surface 42 of the radiation absorption layer 4 as the thickness of the radiation absorption layer increases. The reason for this is that the perovskite material which tends to be crystallized in a layer shape is exposed on the side surface 42 of the radiation absorption layer 4 of which an area has been increased with an increase the thickness of the radiation absorption layer 4. In the radiation detector 1A, attention is paid to this point and the protective member 7 is brought into contact with the side surface 42 of the radiation absorption layer 4 formed of a perovskite material, thereby ensuring sufficient mechanical strength and the moisture-proofness that cannot be ensured only with the moisture-proof layer 8 in the side surface 42 of the radiation absorption layer 4. It should be noted that, although it is also conceivable that the radiation absorption layer 4 be formed to become gradually thinner at a peripheral portion thereof so as to sufficiently cover the peripheral portion with the moisture-proof layer 8, in this case, a dead space becomes larger and a size of the radiation detector 1A increases.

In the radiation detector 1A, the protective member 7 forms an opening region A on one side with respect to the radiation absorption layer 4 and the voltage application electrode 6. Accordingly, since it is not necessary for the protective member 7 to be disposed on one side with respect to the radiation absorption layer 4 and the voltage application electrode 6, it is possible to simplify a configuration of the radiation detector 1A.

Further, in the radiation detector 1A, the protective member 7 is formed of an insulating material or a conductive material. When the protective member 7 is formed of an insulating material, it is difficult for an electric field generated between the charge collection electrode 13 and the voltage application electrode 6 near the protective member 7 to be influenced by the protective member 7, and therefore, it is possible to suppress degradation of electrical characteristics in the charge collection electrode 13 near the protective member 7. When the protective member 7 is formed of a conductive material, it is difficult for the electric field generated between the charge collection electrode 13 and the voltage application electrode 6 near the protective member 7 to be influenced by the protective member 7, for example, by electrically connecting the protective member 7 to a constant potential, and therefore, it is possible to suppress degradation of electrical characteristics in the charge collection electrode 13 near the protective member 7.

Further, in the radiation detector 1A, the voltage application electrode 6 is spaced apart from the protective member 7. Accordingly, it is possible to prevent such a situation in which uniformity of the electric field generated between the charge collection electrode 13 and the voltage application electrode 6 is impaired due to contact between the voltage application electrode 6 and the protective member 7.

Further, in the radiation detector 1A, the radiation absorption layer 4 and the voltage application electrode 6 are covered with the moisture-proof layer 8. Accordingly, it is possible to ensure sufficient moisture-proofness in the radiation absorption layer 4 and the voltage application electrode 6 more reliably.

Further, in the radiation detector 1A, the flat surface 41a on which the voltage application electrode 6 is disposed in the surface 41 of the radiation absorption layer 4 is located on the panel 10 side with respect to the end surface 7a of the protective member 7. The curved surface 41b located between the flat surface 41a and the surface 7b of the protective member 7 in the surface 41 of the radiation absorption layer 4 is curved to become closer to the end surface 7a of the protective member 7 as a distance from the flat surface 41a increases. Accordingly, it is difficult for an external force to be transmitted to the voltage application electrode 6 even when the protective member 7 peels off from the radiation absorption layer 4 and an external force acts on the protective member 7. Further, the presence of the curved surface 41b more reliably prevents contact between the voltage application electrode 6 and the protective member 7. Furthermore, the presence of the curved surface 41b makes it easier for the moisture-proof layer 8 to be adhered to the radiation absorption layer 4 and the voltage application electrode 6, as compared with a case in which the curved surface 41b is not present and the flat surface 41a reaches the surface 7b of the protective member 7.

Further, in the radiation detector 1A, the thickness of the radiation absorption layer 4 is equal to or greater than 100

µm and equal to or smaller than 1 mm. Thus, it is possible to improve both absorption efficiency of X-rays and collection efficiency of charge.

Next, a method for manufacturing the radiation detector 1A will be described. First, an alkyl ammonium halide ($CH_3NH_3X$ (X indicates at least one of I, Br and Cl, the same applies below)) and a lead halide ($PbY_2$ (X indicates at least one of I, Br and Cl, the same applies below)) are mixed with an organic solvent to prepare a precursor solution of methylammonium lead halide ($CH_3NH_3PbZ_3$ (Z indicates at least one of I, Br and Cl, the same applies below)) that is a perovskite material. A mixing ratio is preferably $CH_3NH_3X$:$PbY_2$=2:1 to 1:3 in terms of a molar ratio, and particularly preferably $CH_3NH_3X$:$PbY_2$=1:1 in a molar ratio. The organic solvent may be an organic solvent capable of dissolving $CH_3NH_3X$, $PbX_2$, and $CH_3NH_3PbZ_3$, may be formed of one kind of solvent, or may be formed of a mixture of two or more kinds of solvent. Examples of the organic solvent include γ-butyrolactone, N-methyl-2-pyrrolidone, and N,N-dimethylformamide.

On the other hand, a resin is applied to the surface 10a of the panel 10 with a dispenser to form an annular frame member having a height of 300 µm, for example. That is, the annular frame member is disposed on one side with respect to the panel 10 (first step). The frame member is a member corresponding to the protective member 7. A material of the frame member may be an insulating material or may be a conductive material. Examples of the material of the frame member are a resin, a photoresist material, glass, and metal. In short, any material can be used as the material of the frame member as long as the material can hold a height, has good adhesion to the surface 10a of the panel 10, and does not react with the above-described solvent. When the frame member is formed of a conductive material, the frame member functions as a guard ring when the frame member is electrically connected to a constant potential (for example, a ground potential or a reference potential). The height of the frame member is preferably 30 µm or more, and particularly preferably 100 µm or more.

Subsequently, the panel 10 having the frame member formed thereon is annealed. This annealing can be performed using, for example, a hot plate, a thermostatic oven, or an electric furnace. An annealing temperature is preferably 60° C. to 160° C., particularly preferably 100° C. to 140° C. A prepared precursor solution of the perovskite material is poured into the frame member formed on the surface 10a of the panel 10 while this annealing is being performed. That is, the precursor solution containing the perovskite material and the solvent is disposed inside the frame member (second step). It should be noted that the amount of the precursor solution poured in can be appropriately adjusted according to the thickness of the radiation absorption layer 4 to be desired to be finally obtained.

Then, the radiation absorption layer 4 is formed by volatilizing the solvent in the precursor solution by annealing. That is, the solvent is removed from the precursor solution so as to form the radiation absorption layer 4 formed of the perovskite material (third step). When the solvent in the precursor solution is volatilized by annealing, a central portion of the radiation absorption layer 4 gradually becomes smaller, and a gradual decrease in size of a peripheral portion of the radiation absorption layer 4 is restricted due to a surface tension acting between the radiation absorption layer 4 and the frame member. Accordingly, the surface 41 of the radiation absorption layer 4 has a shape including the flat surface 41a and the curved surface 41b. It should be noted that this annealing may be performed in the air or may be performed in an atmosphere controlled environment (for example, in dry air, in an inert gas, or in a solvent atmosphere).

Subsequently, the voltage application electrode 6 is formed on the flat surface 41a of the radiation absorption layer 4. That is, the voltage application electrode 6 is disposed on one side of the radiation absorption layer 4 (fourth step). The voltage application electrode 6 can be formed by spray coating, screen printing, spin coating or the like. Alternatively, the voltage application electrode 6 can be formed by a vapor deposition method, a sputtering method, or the like. It should be noted that it is preferable for the voltage application electrode 6 to be spaced apart from the protective member 7 by 1 µm or more.

Subsequently, the moisture-proof layer 8 is formed to cover all outer surfaces of the panel 10, the radiation absorption layer 4, the voltage application electrode 6, and the protective member 7. That is, the moisture-proof layer 8 covering the radiation absorption layer 4 and the voltage application electrode 6 is formed in a state in which the entire frame member is left as the protective member 7 in contact with the side surface 42 of the radiation absorption layer 4 (fifth step). For example, the moisture-proof layer 8 can be formed by forming a resin film through vapor deposition or the like or forming an oxide film or a nitride film through ALD, CVD or the like.

As described above, according to the method for manufacturing the radiation detector 1A, it is possible to obtain the radiation detector 1A of which sufficient mechanical strength and moisture-proofness have been ensured in the radiation absorption layer 4 formed of the perovskite material. In particular, since the radiation absorption layer 4 is formed after the frame member is formed on the panel 10 and the frame member is used as the protective member 7, adhesion between the radiation absorption layer 4 and the protective member 7 is improved, as compared to a case in which the protective member 7 is formed after the radiation absorption layer 4 is formed on the panel 10. In particular, since the perovskite material tends to be crystallized in a layer shape, effects thereof are significant. Accordingly, the mechanical strength can be improved, and more reliable moisture-proofness can be achieved when the protective member 7 annularly surrounds the side surface 42 of the radiation absorption layer 4.

Second Embodiment

Figure 4:
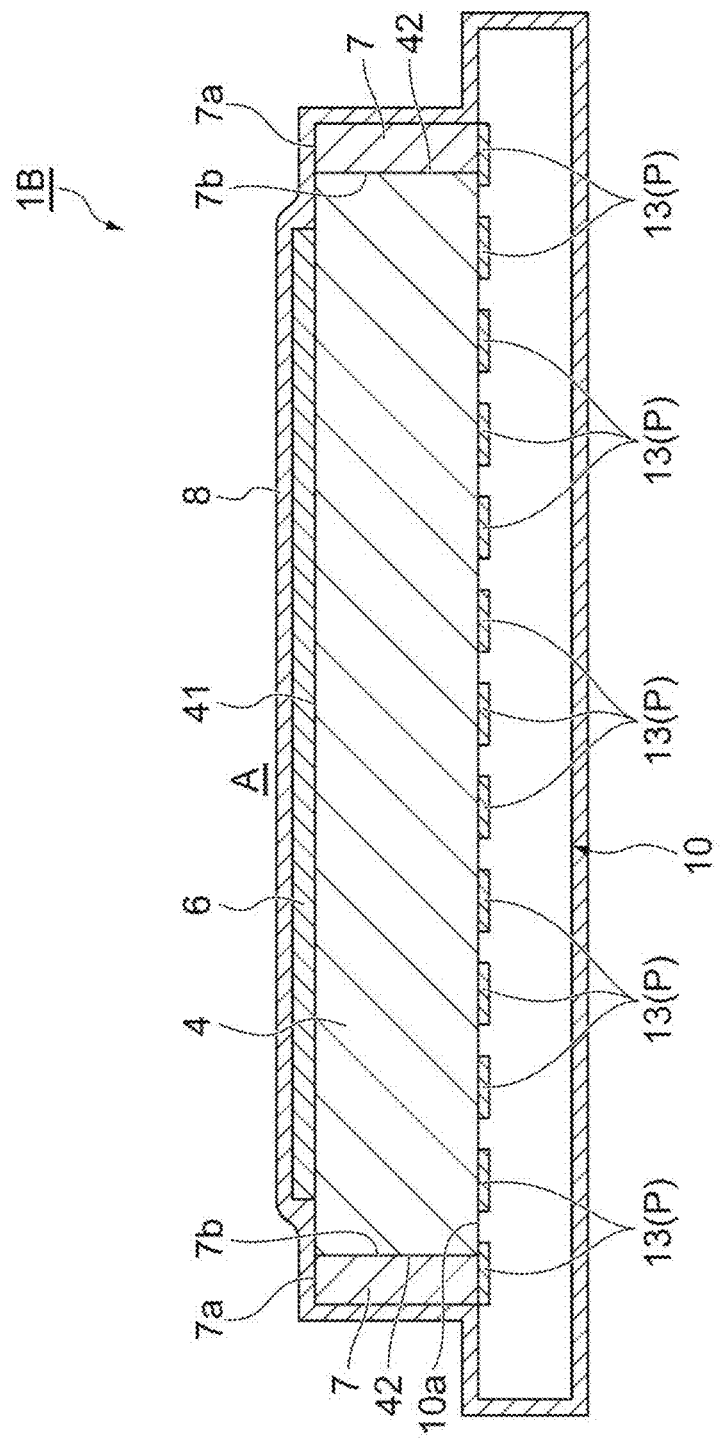
FIG. 4 is a cross-sectional view of a radiation detector according to a second embodiment.

As illustrated in FIG. 4, a radiation detector 1B is different from the above-described radiation detector 1A in that the surface 41 of the radiation absorption layer 4 is a flat surface flush with the end surface 7a of the protective member 7. That is, in the radiation detector 1B, a distance from the surface 10a of the panel 10 to the surface 41 of the radiation absorption layer 4 (that is, the thickness of the radiation absorption layer 4) is substantially the same as a distance from the surface 10a of the panel 10 to the end surface 7a of the protective member 7 (that is, the height of the protective member 7).

The method for manufacturing the radiation detector 1B is the same as the above-described method for manufacturing the radiation detector 1A except for the following points. That is, in a step (second step) of disposing the precursor solution containing the perovskite material and the solvent inside the frame member, the precursor solution is poured into the frame member so that a liquid surface of the precursor solution is raised from an upper surface of the frame member using a surface tension. In this case, the amount of the precursor solution poured in is appropriately adjusted according to the thickness of the radiation absorption layer 4 to be desired to be finally obtained.

According to the above radiation detector 1B, the same operations and effects as those of the radiation detector 1A described above can be obtained.

Further, in the radiation detector 1B, the thickness of the radiation absorption layer 4 can be increased, and a portion near the protective member 7 in the radiation absorption layer 4 can be used as an effective region.

Modification Example

Although the first and second embodiments of the present disclosure have been described above, the radiation detector and the method for manufacturing the same according to the present disclosure are not limited to the first embodiment and the second embodiment. For example, although the protective member 7 is annularly formed in the first embodiment and the second embodiment, a portion of the protective member 7 may be cut off as long as the protective member 7 is in contact with at least portions opposite to each other in the side surface 42 of the radiation absorption layer 4. The radiation detector including the protective member 7 of which the portion has been cut off can be manufactured by pouring the precursor solution into the annular frame member to form the radiation absorption layer 4 and then cutting off a portion of the frame member, as described above. Alternatively, the radiation detector including the protective member 7 of which the portion has been cut off can be manufactured by pouring the precursor solution into the frame member of which a portion has been cut off to form the radiation absorption layer 4. In this case, a width of the portion cut off in the frame member may be adjusted to such a degree that the precursor solution does not leak from the portion due to a surface tension. That is, a shape of the frame member may be a continuous annular shape or an annular shape of which a portion is cut off with such a width that the precursor solution does not leak due to the surface tension.

Figure 5:
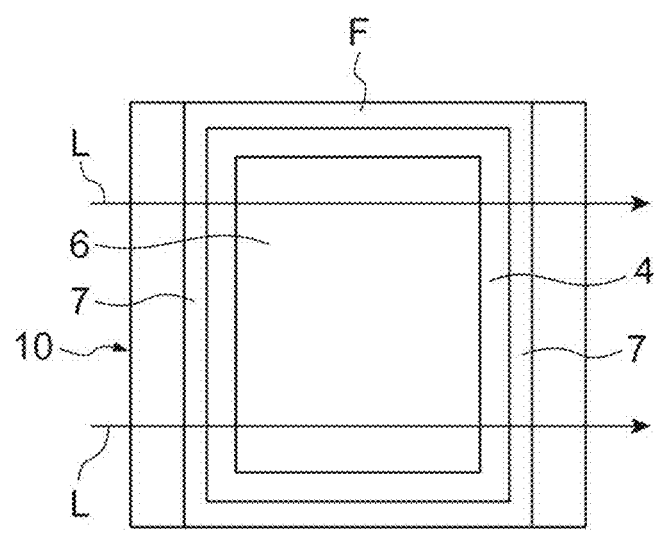
FIG. 5 is a plan view illustrating a step in a method for manufacturing a radiation detector according to a modification example.

Further, the radiation detector may include a plurality of protective members 7 as long as the protective members are in contact with at least portions opposite to each other in the side surface 42 of the radiation absorption layer 4. The radiation detector including the plurality of protective members 7 being in contact with the portions opposite to each other in the side surface 42 of the radiation absorption layer 4 can be manufactured by pouring the precursor solution into the annular frame member F to form the radiation absorption layer 4 and then cutting off both side portions of the panel 10, the radiation absorption layer 4, the voltage application electrode 6, and the frame member F, as illustrated in FIG. 5. In this case, the moisture-proof layer 8 covering at least the radiation absorption layer 4 and the voltage application electrode 6 is formed in a state in which at least a portion of the frame member F is left as the protective member 7 being in contact with at least portions opposite to each other in the side surface 42 of the radiation absorption layer 4 (step 5). Thus, the protective member 7 being in contact with at least portions opposite to each other in the side surface 42 of the radiation absorption layer 4 is effective in ensuring the mechanical strength of the radiation absorption layer 4.

Further, although the entire outer surface of the panel 10, the radiation absorption layer 4, the voltage application electrode 6, and the protective member 7 is covered in the first embodiment and the second embodiment, the moisture-proof layer 8 may cover at least the radiation absorption layer 4 and the voltage application electrode 6. In this case, it is also possible to more reliably ensure sufficient moisture-proofness in the radiation absorption layer 4 and the voltage application electrode 6.

Further, a bias voltage may be applied to the voltage application electrode 6 so that a positive potential difference is generated between the voltage application electrode 6 and each charge collection electrode 13. In this case, each charge collection electrode 13 collects holes generated in the radiation absorption layer 4 due to absorption of X-rays. Further, each of the radiation detectors 1A and 1B can detect radiation other than the X-rays.

Further, not only a glass substrate but also a silicon substrate or the like can be used as the support substrate 11. In this case, a CMOS ASIC may be formed using an FET formed on a silicon substrate instead of a thin film transistor. That is, the panel 10 may be any substrate as long as the substrate includes a plurality of charge collection electrodes and a potential difference is generated between the voltage application electrode and each charge collection electrode.

REFERENCE SIGNS LIST 1A, 1B: radiation detector, 4: radiation absorption layer, 41: surface, 41a: flat surface, 41b: curved surface, 42: side surface, 6: voltage application electrode, 7: protective member, 7a: end surface, 7b: surface, 8: moisture-proof layer, 10: panel (substrate), 13: charge collection electrode, A: opening region.

The invention claimed is:

1. A radiation detector comprising: a substrate having a plurality of charge collection electrodes; a radiation absorption layer disposed on one side with respect to the substrate and formed of a perovskite material; a voltage application electrode disposed on the one side with respect to the radiation absorption layer, a bias voltage being applied to the voltage application electrode so that a potential difference is generated between the voltage application electrode and each of the plurality of charge collection electrodes; and a protective member disposed on the one side with respect to the substrate and being in contact with at least portions opposite to each other in a side surface of the radiation absorption layer, wherein the protective member does not cover the radiation absorption layer and the voltage applying electrode from the one side.

2. The radiation detector according to claim 1, wherein the protective member forms an opening region on the one side with respect to the radiation absorption layer and the voltage application electrode.

3. The radiation detector according to claim 1, wherein the protective member is formed of an insulating material.

4. The radiation detector according to claim 1, wherein the protective member is formed of a conductive material.

5. The radiation detector according to claim 4, wherein the protective member is electrically connected to a constant potential.

6. The radiation detector according to claim 1, wherein the voltage application electrode is spaced apart from the protective member.

7. The radiation detector according to claim 1,
wherein a surface on the one side in the radiation absorption layer includes a flat surface on which the voltage application electrode is disposed and a curved surface located between the flat surface and a surface on the radiation absorption layer side in the protective member, the flat surface is located on the substrate side with respect to an end surface on the one side in the protective member, and the curved surface is curved to become closer to the end surface of the protective member as a distance from the flat surface increases.

8. The radiation detector according to claim 1, wherein the surface on the one side in the radiation absorption layer is a flat surface flush with an end surface on the one side in the protective member.

9. The radiation detector according to claim 1, further comprising a moisture-proof layer that covers at least the radiation absorption layer and the voltage application electrode.

10. The radiation detector according to claim 1, wherein the protective member annularly surrounds the side surface of the radiation absorption layer.

11. The radiation detector according to claim 1, wherein the thickness of the radiation absorption layer is equal to or greater than 100 μm and equal to or smaller than 1 mm.

12. A method for manufacturing a radiation detector, the method comprising: a first step of disposing a frame member on one side with respect to a substrate including a plurality of charge collection electrodes; a second step of disposing a solution containing a perovskite material and a solvent inside the frame member; a third step of removing the solvent from the solution to form a radiation absorption layer formed of the perovskite material; a fourth step of disposing a voltage application electrode on the one side with respect to the radiation absorption layer; and a fifth step of forming a moisture-proof layer covering at least the radiation absorption layer and the voltage application electrode in a state in which at least a portion of the frame member is left as a protective member being in contact with at least portions opposite to each other in a side surface of the radiation absorption layer, and the protective member does not cover the radiation absorption layer and the voltage applying electrode from the one side.

* * * * *